US012651634B2

(12) United States Patent     (10) Patent No.:   US 12,651,634 B2

Wang et al.     (45) Date of Patent:    Jun. 9, 2026

(54) MEMORY DEVICES AND OPERATING METHODS THEREOF, MEMORY SYSTEMS, WORD LINE VOLTAGE CONTROL CIRCUITS

(71) Applicant: YANGTZE MEMORY TECHNOLOGIES CO., LTD., Wuhan (CN)

(72) Inventors: Yu Wang, Wuhan (CN); Daesik Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 168 days.

(21) Appl. No.: 18/396,529

(22) Filed: Dec. 26, 2023

(65)        Prior Publication Data

US 2025/0174276 A1     May 29, 2025

Related U.S. Application Data

(63) Continuation of application No. PCT/CN2023/134715, filed on Nov. 28, 2023.

(51) Int. Cl.
    *G11C 16/30*       (2006.01)
    *G11C 16/04*       (2006.01)
           (Continued)

(52) U.S. Cl.
    CPC .......... *G11C 16/08* (2013.01); *G11C 16/0433* (2013.01); *G11C 16/30* (2013.01);
           (Continued)

(58) Field of Classification Search
    CPC ..... G11C 16/08; G11C 16/0433; G11C 16/30; G11C 11/4085; G11C 8/08; G11C 8/14; G11C 11/4074; G06F 3/0658
    See application file for complete search history.

(56)        References Cited

U.S. PATENT DOCUMENTS 10,957,394 B1    3/2021   Chen et al.
11,017,853 B2 *   5/2021   Kim ................... G11C 13/0033
           (Continued)

FOREIGN PATENT DOCUMENTS

CN       1442858 A     9/2003
CN    114067881 A     2/2022
           (Continued)

OTHER PUBLICATIONS

Supplementary European Search Report issued in corresponding European Application No. 23925602.7, mailed on Dec. 18, 2025, 9 pages.

*Primary Examiner* — Alexander Sofocleous
*Assistant Examiner* — Joseph Fidelis Stormes
(74) *Attorney, Agent, or Firm* — BAYES PLLC

(57)           ABSTRACT

The present disclosure provides memory devices, operating methods thereof, memory systems, and word line voltage control circuits. A disclosed memory device comprises an array of memory cells, a plurality of word lines coupled with the memory cells, and a peripheral circuit coupled to the memory cells through the word lines. The peripheral circuit is configured to reduce a first voltage on a non-selected word line adjacent to a selected word line to a second voltage, provide a pre-charge voltage to the selected word line, increase the second voltage on the non-selected word line to a third voltage, and float the selected word line.

20 Claims, 12 Drawing Sheets

(51) Int. Cl.

| | |
|---|---|
| *G11C 16/08* | (2006.01) |
| *G06F 3/06* | (2006.01) |
| *G11C 7/02* | (2006.01) |
| *G11C 8/08* | (2006.01) |
| *G11C 8/14* | (2006.01) |
| *G11C 11/4074* | (2006.01) |
| *G11C 11/408* | (2006.01) |

(52) U.S. Cl.
CPC .............. *G06F 3/0658* (2013.01); *G11C 7/02* (2013.01); *G11C 8/08* (2013.01); *G11C 8/14* (2013.01); *G11C 11/4074* (2013.01); *G11C 11/4085* (2013.01)

(56) References Cited

U.S. PATENT DOCUMENTS

| | | | |
|---|---|---|---|
| 2016/0064056 A1* | 3/2016 | Kim ......................... | G11C 7/02 |
| | | | 365/189.11 |
| 2019/0147955 A1 | 5/2019 | Chen et al. | |
| 2022/0406360 A1* | 12/2022 | Lee .......................... | G11C 8/14 |
| 2023/0162781 A1 | 5/2023 | Jo | |

FOREIGN PATENT DOCUMENTS

| | | | |
|---|---|---|---|
| CN | 114121100 | A | 3/2022 |
| CN | 116072186 | A | 5/2023 |
| CN | 116153356 | A | 5/2023 |
| KR | 20200062463 | A | 6/2020 |
| KR | 20210013435 | A | 2/2021 |
| KR | 102458340 | B1 | 10/2022 |
| TW | 201434047 | A | 9/2014 |

* cited by examiner

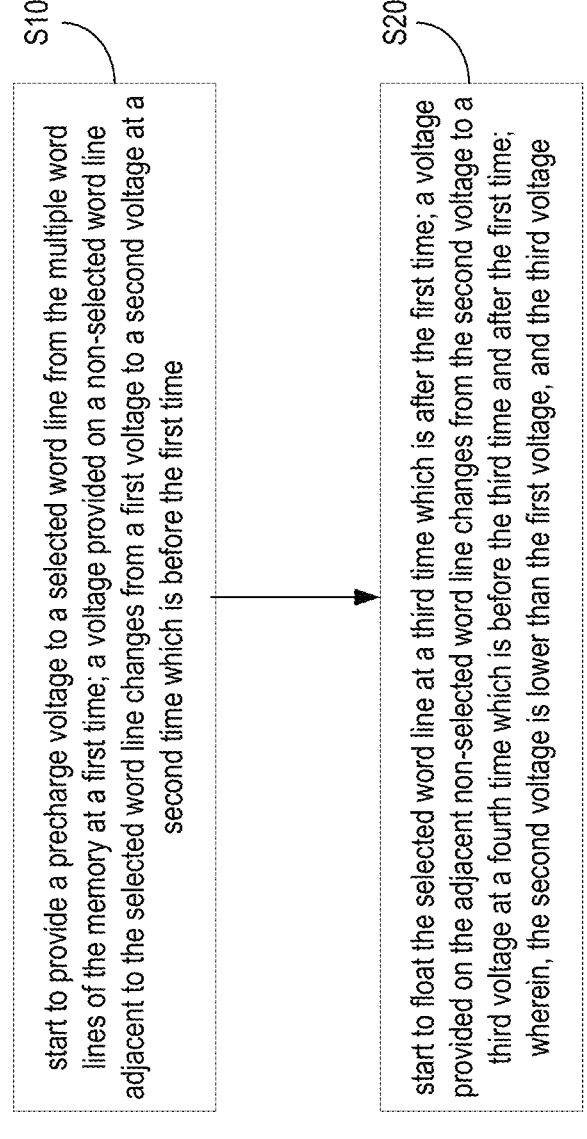

start to provide a precharge voltage to a selected word line from the multiple word lines of the memory at a first time; a voltage provided on a non-selected word line adjacent to the selected word line changes from a first voltage to a second voltage at a second time which is before the first time

S10 start to float the selected word line at a third time which is after the first time; a voltage provided on the adjacent non-selected word line changes from the second voltage to a third voltage at a fourth time which is before the third time and after the first time; wherein, the second voltage is lower than the first voltage, and the third voltage

MEMORY DEVICES AND OPERATING METHODS THEREOF, MEMORY SYSTEMS, WORD LINE VOLTAGE CONTROL CIRCUITS

CROSS-REFERENCE TO RELATED APPLICATIONS

This application is a continuation of International Application No. PCT/CN2023/134715, filed on Nov. 28, 2023, which is incorporated herein by reference in its entirety.

TECHNICAL FIELD

The present disclosure relates to the field of semiconductors, in particular to memory devices and operating methods thereof, memory systems, word line voltage control circuits.

BACKGROUND

As the density of memories continues to increase, memory cells are characterized by shrinking physical volumes, and the word lines in the memory cells are physically closer, and the capacity coupling between adjacent word lines increases. When the number of accesses to a certain row in a memory cell exceeds a threshold, it may cause data on rows which are adjacent to the row to be abnormal, this phenomenon is usually referred to as row hammer.

SUMMARY

In a first aspect, an example of the present disclosure provides a memory, the memory comprising an array of memory cells and a peripheral circuit coupled to the array of memory cells; the array of memory cells includes plurality of word lines; the peripheral circuit is configured to: start to provide a pre-charge voltage to a selected word line from the plurality of word lines at a first time; wherein a voltage provided on a non-selected word line adjacent to the selected word line is changed from a first voltage to a second voltage at a second time which is before the first time; and start to float the selected word line at a third time which is after the first time; wherein a voltage provided on the adjacent non-selected word line is changed from the second voltage to a third voltage at a fourth time which is before the third time and after the first time; wherein, the second voltage is lower than the first voltage, and the third voltage.

In a second aspect, an example of the present disclosure provides a memory system, including the memory in the scheme described above; and a controller coupled to the memory and configured to control the memory.

In a third aspect, an example of the present disclosure provides a control circuit for word line voltage, including: a first voltage transfer circuit configured to provide a first transfer voltage in response to a first enable signal before starting to provide a pre-charge voltage to a selected word line; a second voltage transfer circuit configured to provide a second transfer voltage in response to a second enable signal before starting to float the selected word line and after starting to provide a pre-charge voltage to the selected word line; a driving circuit for local word line, connected to both the first voltage transfer circuit and the second voltage transfer circuit, and configured to connect a non-selected word line adjacent to the selected word line to the first voltage transfer circuit before a pre-charge voltage is started to be provided to the selected word line, and to connect the adjacent non-selected word line to the second voltage transfer circuit before the selected word line is started to be floated and after a pre-charge voltage is started to be provided to the selected word line.

In a fourth aspect, an example of the present disclosure provides a method for operating a memory, the method includes: starting to provide a pre-charge voltage to a selected word line from the plurality of word lines of the memory at a first time; wherein a voltage provided on a non-selected word line adjacent to the selected word line is changed from a first voltage to a second voltage at a second time which is before the first time; and starting to float the selected word line at a third time which is after the first time; wherein a voltage provided on the adjacent non-selected word line is changed from the second voltage to a third voltage at a fourth time which is before the third time and after the first time; wherein, the second voltage is lower than the first voltage, and the third voltage.

BRIEF DESCRIPTION OF THE DRAWINGS

In the accompanying drawings, unless otherwise specified, same reference numbers refer to same or similar parts or elements throughout multiple accompanying drawings. The accompanying drawings are not necessarily to scale. It is to be understood that these accompanying drawings depict only some examples disclosed in accordance with the present disclosure and should not be considered as limiting the scope of the present disclosure.

FIG. 10 is a schematic flowchart of an implementation of a method for operating a memory provided by an example of the present disclosure.

DETAILED DESCRIPTION

Figure 1:
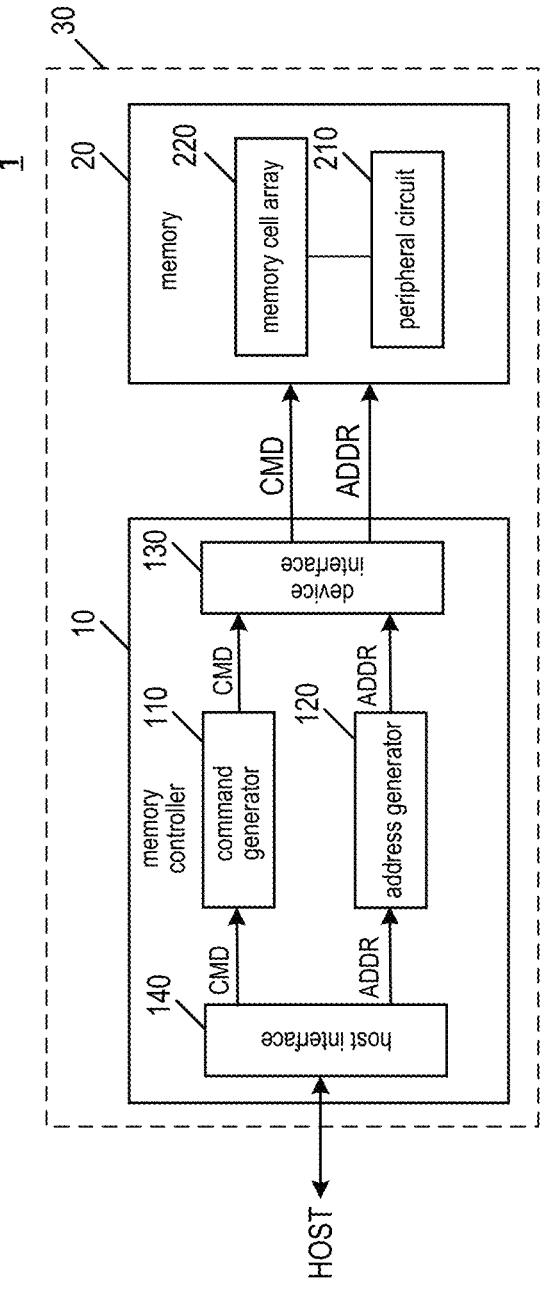
FIG. 1 shows a schematic structural diagram of an example electronic device 1 including a memory according to an example of the present disclosure.

Example implementations disclosed in the present disclosure will be described in more detail below with reference to the accompanying drawings. Although example implementations of the present disclosure are shown in the accompanying drawings, it is to be understood that the present disclosure may be implemented in various forms and should not be limited to the specific implementations set forth herein. Rather, these examples are provided so that the present disclosure can be more thoroughly understood. and the scope of the present disclosure can be fully conveyed to those skilled in the art.

In the following description, numerous specific details are given in order to provide a more thorough understanding of the present disclosure. However, it will be apparent to one skilled in the art that the present disclosure may be practiced without one or more of these details. In other examples, in order to avoid confusion with the present disclosure, some technical features known in the art are not described; that is, not all features of the actual example are described here, and well-known functions and structures are not described in detail.

Furthermore, accompanying drawings are merely schematic illustrations of the present disclosure and are not necessarily drawn to scale. Same reference numerals in the accompanying drawings represent same or similar parts, and thus repeated description thereof will be omitted. Some of the block diagrams shown in the accompanying drawings are functional entities and do not necessarily correspond to physically or logically separate entities. These functional entities may be implemented in software form, or implemented in one or more hardware modules or integrated circuits, or implemented in different networks and/or processor devices and/or microcontroller devices.

The flowcharts shown in the accompanying drawings are illustrative only and do not necessarily include all steps. For example, some steps may be decomposed, and some steps may be merged or partially merged, thus the actual order of execution may change according to the actual situation.

A term used herein is for the purpose of describing a particular example only and is not to be considered as limitation of the present disclosure. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, steps, operations, elements and/or parts, but do not exclude the presence or addition of one or more other features, integers, steps, operations, elements, parts and/or groups. As used herein, the term "and/or" includes any and all combinations of the associated listed items.

FIG. 1 shows a schematic structural diagram of an example electronic device 1 with a memory according to an example of the present disclosure. The electronic device 1 may be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having memory device therein. As shown in FIG. 1, the electronic device 1 may include a host HOST and a memory system 30, and the memory system 30 includes a memory controller 10 and one or more memories 20. The host HOST may be a processor of the electronic device (e.g., a Central Processing Unit (CPU) or a Graphic Processing Unit (GPU)). The host HOST may be configured to send data to or receive data from memory 20. The memory controller 10 is coupled to the memory 20 and the host HOST and is configured to control the memory 20. The memory controller 10 may manage data stored in the memory 20 and communicate with the host HOST.

The memory controller 10 may be configured to control operations of memory 20, e.g., read, erase, write, and refresh operations. In some implementations, the memory controller 10 is further configured to process Error Correction Code (ECC) related to data read from or written to memory 20. Memory controller 10 may also perform any other suitable functions, e.g., formatting memory 20.

In some specific examples, the memory controller 10 and one or more memories 20 may be integrated into various types of electronic devices, e.g., the memory controller 10 may be integrated into the north bridge of the computer motherboard or directly integrated into the computer CPU, and multiple memories 20 may be integrated into a memory stick. That is, memory system 30 may be implemented and packaged into different types of end electronic products.

The memory controller 10 may send/receive data to/from the host HOST, and may send a command CMD and an address ADDR to the memory 20. The memory controller 10 may include a command generator 110, an address generator 120, a device interface 130, and a host interface 140. The host interface 140 may receive the command CMD and the address ADDR from the host HOST, and the command generator 110 may generate an access command, a row hammer refresh command, etc., through decoding the command CMD received from the host HOST, and may provide the access command and row hammer refresh command to the memory 20 through the device interface 130. The access command may be a signal that indicates the memory 20 to write or read data through accessing the row of the array of memory cells 220 corresponding to the address ADDR. The row hammer refresh command may be a signal that commands memory 20 to perform additional refresh operation on a word line adjacent to the word line that is intensively accessed in a short period of time. In other words, an additional refresh operation may be performed on a word line adjacent to the word line that is accessed multiple times in a short period of time. A large number of accesses may be the result of repeated requests to access the same word line.

The address generator 120 in the memory controller 10 may generate row addresses and column addresses to be accessed in the array of memory cells 220 by decoding the address ADDR received from the host interface 140. Additionally, the memory 20 may generate an address of a bank to be accessed when the array of memory cells 220 includes multiple banks.

Additionally, the memory controller 10 may control memory operations such as write and read by providing various signals to the memory 20 via device interface 130. For example, the memory controller 10 may provide a write command to the memory 20. The write command is to indicate the memory 20 to perform a write operation to store data into the memory 20. In some examples, the memory 20 includes an array of memory cells 220 and a peripheral circuit 210; wherein the array of memory cells 220 includes multiple banks, each bank includes multiple blocks, and each block includes multiple memory cell rows and multiple memory cell columns, each memory cell row is coupled to a corresponding word line, and each memory cell column is coupled to a corresponding bit line. The peripheral circuit 210 may write data to or read data from the array of memory cells 220 based on the command CMD and the address ADDR received from the memory controller 10, or may provide a control signal CTRL for refreshing the memory cells included in the array of memory cells 220 to the row decoder and the column decoder. In other words, the peripheral circuit 210 may perform all operations to process data in the array of memory cells 220. The peripheral circuit 210 may include: a control circuit corresponding to each block, e.g., a Sensing Amplifier (SA) and a Word-Line Driver (WLD), etc., a control circuit corresponding to each bank, e.g., a row decoder, a column decoder, etc., and a control circuit corresponding to all banks, e.g., a command buffer, a command decoder, an address buffer, a data input/output buffer, a mode register, etc.

The memory 20 may be Random Access Memory (RAM), such as Dynamic Random Access Memory (DRAM), synchronous DRAM (SDRAM), static RAM (SRAM), Double Data Rate SDRAM (DDR SDRAM), DDR2 SDRAM, DDR3 SDRAM, Phase Change RAM (PRAM), Magnetic RAM (MRAM), Resistive RAM (RRAM), etc. The following description only takes DRAM as an example for explanation.

Figure 2:
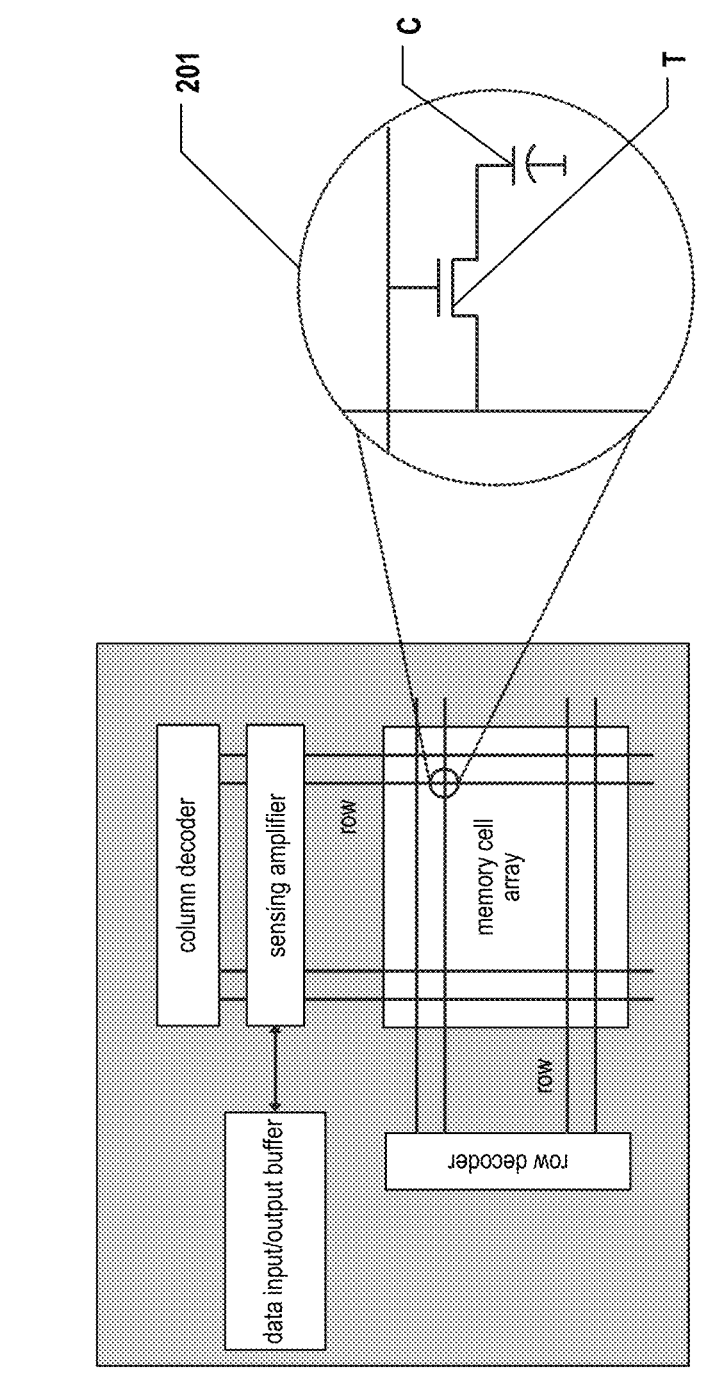
FIG. 2 is a schematic diagram of an example dynamic random access memory according to an example of the present disclosure.
Figure 3:
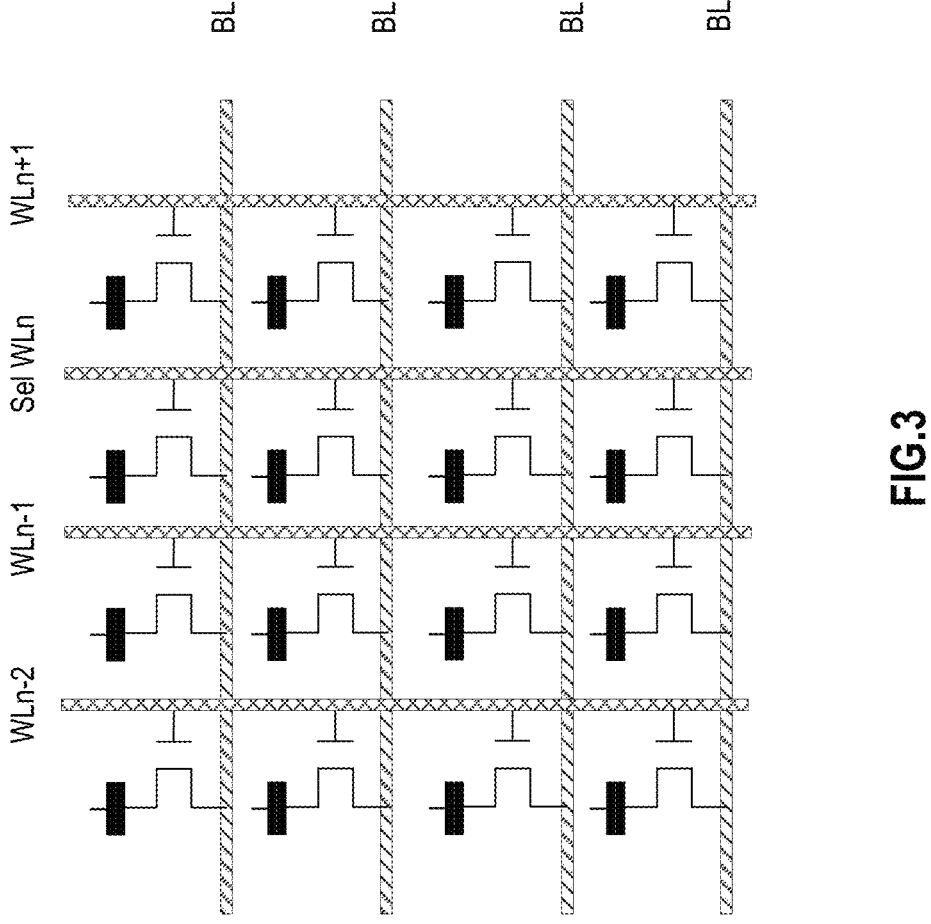
FIG. 3 is a schematic connection diagram of word lines, bit lines and memory cells of an example dynamic random access memory according to an example of the present disclosure.

FIG. 2 is a schematic diagram of an example dynamic random access memory according to an example of the present disclosure; FIG. 3 is a schematic connection diagram of word lines, bit lines and memory cells of an example dynamic random access memory according to an example of the present disclosure.

The right side in FIG. 2 shows a circuit of the memory cells in DRAM. DRAM includes at least one DRAM die, each DRAM die includes an array of memory cells, the array of memory cells includes a plurality of memory cells 201 arranged in an array, and each memory cell 201 includes a transistor T and a capacitor C, the main working principle of the memory cell is to represent whether a binary bit is 1 or 0 depending on the amount of charge stored in the capacitor. The memory cells are arranged in an array, which may be regarded as a typical mesh structure, and reference may be made to FIG. 3 for details of the mesh structure. The array of memory cells employs a row and a column to specify an address. By specifying an intersection of a row and a column (by specifying a row address and a column address of a DRAM), a memory controller may independently access each memory cell in the DRAM die and perform operations such as read, write or refresh on the data stored in it.

The memory cell of DRAM is essentially a capacitor that stores charge, and during the read, write and refresh processes, the capacitance may leak, and the read process itself is destructive. Based on this, a refresh operation is required to be performed after a read operation, or when the memory cell is not accessed for a long time.

The data stored in the memory cell is determined by the charge in the capacitor, and the charge is easily affected between refresh cycles. Drifting electrons may migrate into and out of the memory cell, thereby changing the charge in the memory cell. If a line of address is accessed too many times during a short period of time, memory cells in lines adjacent to the address may accumulate enough charge changes to change the state sensed for the stored value. This is the Row Hammer phenomenon. As the size decreases, it is possible that not just adjacent rows are affected by changes in the state sensed for the stored value, but even nearby rows (which are separated by two or more rows) may be affected.

Figure 4:
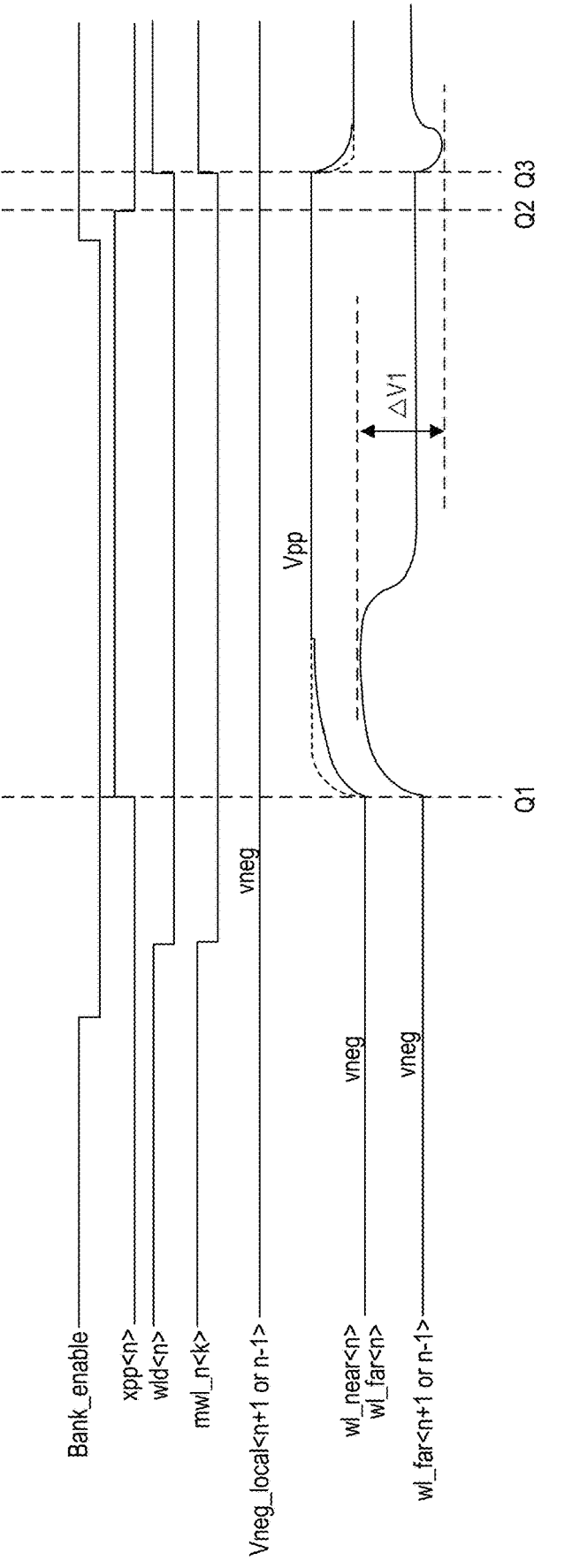
FIG. 4 is a schematic diagram of timing of the voltages of relevant signals, word lines and voltage transfer lines when a selected word line is accessed provided by an example of the present disclosure.

FIG. 4 is a schematic diagram of the voltage timing of relevant signals, word lines and voltage transfer lines when a selected word line is accessed, provided by an example of the present disclosure. It should be noted that the selected word line wl<n> involved below may be understood as the word line connected to the memory cell to be accessed, and the selected word line, similar to the selected word line, is to determine the target memory cell which is to be read, written, or performed other operations on, thus the two terms may be used interchangeably and express similar meanings; the adjacent non-selected word line wl<n+1 or n−1> may be understood as the word line adjacent to the physical address of the selected word line; Vneg_local<n> may be understood as a voltage transfer line with one end coupled to the select word line and providing voltage to the select word line, and the other end of Vneg_local<n> is coupled to the power supply terminal; Vneg_local<n+1 or n−1> may be understood as a voltage transfer line with one end coupled to the adjacent non-selected word line wl<n+1 or n−1> and providing voltage to the adjacent non-selected word line, similarly, the other end of Vneg_local<n+1 or n−1> is coupled to the power supply terminal. In addition, since the length of the selected word line wl<n> is long, the resistance may not be ignored, thus when coupled to Vneg_local<n>, the end of the selected word line that is close to Vneg_local<n> is referred to as the near end wl_near<n> of the selected word line, and the end of the selected word line that is far away from Vneg_local<n> is referred to as the far end wl_far<n> of the selected word line; similarly, the end of the adjacent non-selected word line that is close to Vneg_local<n+1 or n−1> is referred to as the near end wl_near<n+1 or n−1> of the adjacent non-selected word line, and the end of the adjacent non-selected word line that is far away from Vneg_local<n+1 or n−1> is referred to as the far end wl_far<n+1 or n−1> of the adjacent non-selected word line.

For ease of understanding, an example of the present disclosure takes the far end wl_far<n+1 or n−1> of the adjacent non-selected word line as an example for description, but it is not used to limit the scope of protection of the present disclosure, and the explanation in the example of the present disclosure is also applicable to the near end wl_near<n+1 or n−1> of the adjacent non-selected word line.

As shown in FIG. 4, under the condition that the bank selection signal Bank_enble, the main word line selection signal mwl_n<k>, and the word line selection signal wld<n> are enabled, when the pre-charge control signal xpp<n> switches from the non-enabled state to the enabled state, at the first time node Q1, the memory starts to perform a pre-charge operation on the selected word line, and the time periods for starting to charge from the initial voltage vneg to the voltage Vpp at the first time node Q1 which are required by the near end wl_near<n> of the selected word line (the part shown by the dotted parabola after Q1 in FIG. 4) and the far end wl_far<n> of the selected word line (the part shown by the solid line below the dotted line after Q1 in FIG. 4) are different. It may be understood that since the near end wl_near<n> of the selected word line is closer to Vneg_local<n>, i.e., closer to the power supply terminal, it may be charged to the voltage Vpp faster. The far end wl_far<n> of the selected word line is far away from Vneg_local<n>, thus the time required for charging to the voltage Vpp is longer. It is shown in FIG. 4 that the slope of the parabola part of the dotted line is greater than the slope of the parabola part of the solid line. For the adjacent non-selected word line wl<n+1 or n−1>, the far end wl_far<n+1 or n−1> of the adjacent non-selected word line is taken as an example for description, the voltage on the far end wl_far<n> of the selected word line is started to be charged from the initial voltage vneg to the voltage Vpp at the first time node Q1, in the process of the voltage at the far end wl_far<n> of the selected word line rising, the voltage at the far end wl_far<n+1 or n−1> of the adjacent non-selected word line will gradually rise due to word line coupling. After the far end wl_far<n> of the selected word line stabilizes at the voltage Vpp, the voltage on the far end wl_far<n+1 or n−1> of the adjacent non-selected word line gradually decreases and returns to be equal to or slightly greater than the initial voltage vneg.

After the far end of the selected word line wl_far<n> stabilizes at the voltage Vpp, and at the second time node Q2 at which the pre-charge control signal xpp<n> switches from the enabled state to the non-enabled state, the memory starts to float the selected word line.

Next, at the third time node Q3 after a certain buffer time which has passed since the second time node Q2, the selected word line starts to discharge. Here, the buffer discharge may be achieved through a falling edge delay circuit. For the operation for starting to discharge at the third time node Q3 from the voltage Vpp to the initial voltage vneg, the time period required by the near end wl_near<n> of the selected word line (the part shown by the dotted parabola after Q3 in FIG. 4) is shorter than that required by the far end wl_far<n> of the selected word line (the part shown by the solid line above the dotted line after Q3 in FIG. 4). At this time, in the process of the voltage on the far end wl_far<n> of the selected word line rising, due to word line coupling, the voltage on the far end wl_far<n+1 or n−1> of the adjacent non-selected word line gradually drops below the initial voltage vneg. After the voltage on the far end wl_far<n> of the selected word line stabilizes at the initial voltage vneg, the voltage on the far end wl_far<n+1 or n−1> of the adjacent non-selected word line gradually increases and returns to near the initial voltage vneg. In this way, during the pre-charge operation and subsequent discharge to be performed on the selected word line, when the voltage of the adjacent non-selected word line rises or falls, a large voltage difference will occur on the adjacent non-selected word lines due to coupling, this voltage difference is shown as ΔV1 in FIG. 4, in an aspect, this voltage change ΔV1 may cause the sensing state of the storage value of the memory cell coupled to the adjacent non-selected word line to change, thereby threatening the security of data and aggravating the problem of row hammering; in another aspect, this voltage change ΔV1 may also cause the risk of Gate-Induced Drain Leakage (GIDL), thereby causing hole accumulation and increasing the floating body potential, and the high floating body potential may turn on parasitic transistors between the floating body and the drain junction, thus causing a series of problems.

Increasing the frequency of periodic refreshes may mitigate the hazards brought by row hammering to some extent and may ensure that each row is refreshed before the row hammering causes enough damage for charge in the cell to generate an error. However, the method described above will consume unnecessary time or power, thus increasing system power consumption and reducing system performance. In addition, GIDL leakage is also an unresolved hidden danger.

To that end, the present disclosure proposes the following implementations to reduce the large voltage difference between adjacent non-selected word lines caused by coupling, thereby alleviating the row hammer problem and GIDL leakage problem.

Figure 5:
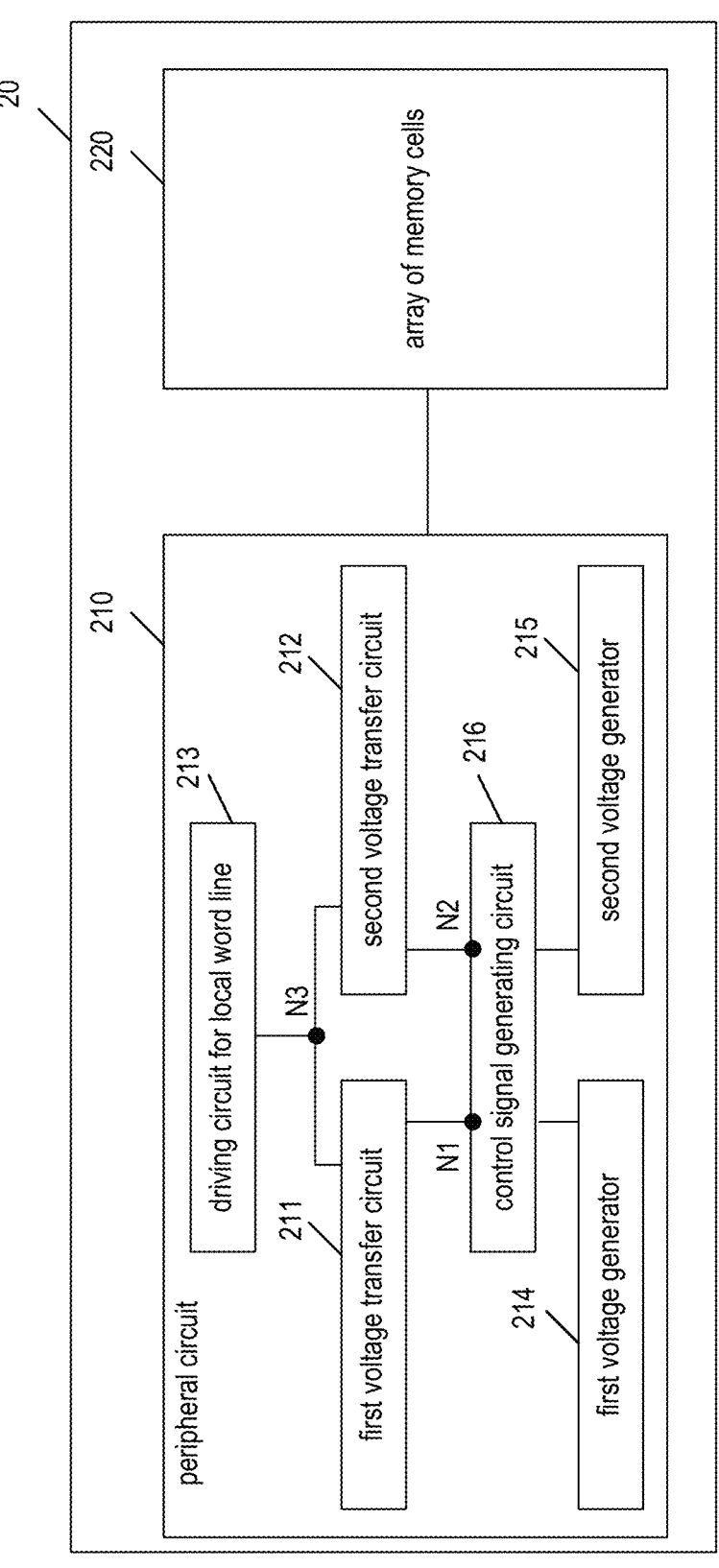
FIG. 5 is a structure schematic diagram of a memory provided by an example of the present disclosure.

An example of the present disclosure provides a memory, as shown in FIG. 5, the memory 20 includes an array of memory cells 220 and a peripheral circuit 210 coupled to the array of memory cells 220; the array of memory cells 220 includes plurality of word lines; the peripheral circuit 210 is configured to: start to provide a pre-charge voltage to a selected word line from the plurality of word lines at a first time; a voltage provided on a non-selected word line adjacent to the selected word line is changed from a first voltage to a second voltage at a second time which is before the first time; and start to float the selected word line at a third time which is after the first time; a voltage provided on the adjacent non-selected word line is changed from the second voltage to a third voltage at a fourth time which is before the third time and after the first time; wherein, the second voltage is lower than the first voltage, and the third voltage.

Figure 6:
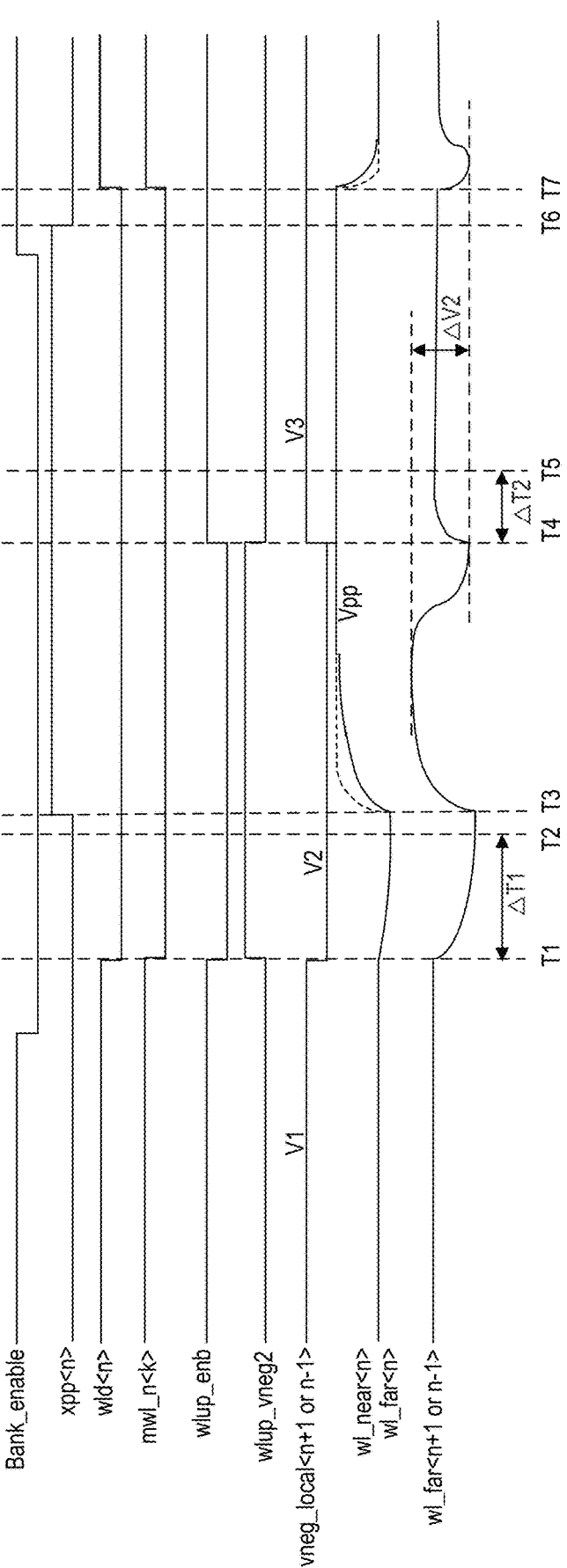
FIG. 6 is a schematic diagram of timing of the voltages of relevant signals, word lines and voltage transfer lines when a selected word line is accessed provided by another example of the present disclosure.

FIG. 6 is a schematic diagram of the voltage timing of relevant signals, word lines and voltage transfer lines when a selected word line is accessed provided by another example of the present disclosure. In some examples, by referring to FIGS. 5 and 6, the peripheral circuit 210 is configured to start to provide a pre-charge voltage Vpp to a selected word line from the plurality of word lines at a third time point T3; a voltage provided on a non-selected word line adjacent to the selected word line is changed from a first voltage V1 to a second voltage V2 at a first time point T1 before the third time point T3; and start to float the selected word line at a sixth time point T6 after the third time point T3; a voltage provided on the adjacent non-selected word line is changed from the second voltage V2 to a third voltage V3 at a fourth time point T4 which is before the sixth time point T6 and after the third time point T3; wherein, the second voltage V2 is lower than the first voltage V1, and the third voltage V3.

In one example, as shown in FIG. 6, under the condition that the bank selection signal Bank_enble, the main word line selection signal mwl_n<k>, and the word line selection signal wld<n> are enabled, when the pre-charge control signal xpp<n> switches from the non-enabled state to the enabled state, at the third time point T3, a pre-charge operation on the selected word line is started to be performed, and the time periods for starting to charge from the first V1 to the pre-charge voltage Vpp at the first time which are required by the near end wl_near<n> of the selected word line (the part shown by the dotted parabola after T1 in FIG. 6) and the far end wl_far<n> of the selected word line (the part shown by the solid line below the dotted line after T1 in FIG. 6) are different.

It should be noted that the enabled states of the bank selection signal Bank_enble, the main word line selection signal mwl_n<k> and the word line selection signal wld<n> are all at a low-level voltage such as Vss, and non-enabled states are all at a high-level voltage such as Vpp or Vdd. The enabled state of the pre-charge control signal xpp<n> is at high-level voltage such as Vpp or Vdd, and the non-enabled state is at a low-level voltage such as Vss.

The wld<n> shown in FIG. 6 represents the word line selection signal for a selected word line, and the word line selection signal corresponding to the adjacent non-selected word line is always in a non-enabled state, i.e., at a high-level voltage, and is not in the shown in FIG. 6.

For the adjacent non-selected word line wl<n+1 or n−1>, the far end wl_far<n+1 or n−1> of the adjacent non-selected word line is taken as an example for description, at the first time point T1 which is before the third time point T3, the voltage on Vneg_local<n+1 or n−1> is changed from the first voltage V1 to the second voltage V2, it may be understood that the voltage provided by Vneg_local<n+1 or n−1> on the far end wl_far<n+1 or n−1> of the non-selected word line adjacent to the selected word line is changed from the first voltage V1 to the second voltage V2, and the second voltage V2 is less than the first voltage V1. In this way, before the selected word line starts to pre-charge at the third time point T3, the voltage provided to the adjacent non-selected word line is reduced in advance, to reduce the initial voltage of the adjacent non-selected word line being pulled up by coupling. In the case that the rising voltage difference between the adjacent non-selected word lines caused by the coupling effect is essentially unchanged, effectively reduces the absolute voltage of the adjacent non-selected word line after being coupled and pulled up.

In the example of the present disclosure, at the sixth time point T6, the pre-charge control signal xpp<n> switches from the enabled state to the non-enabled state, the memory stops the precharging operation on the selected word line, and the memory starts to float the selected word line.

In some examples, as shown in FIG. 6, the memory starts to float the selected word line at the sixth time point T6, and at the seventh time point T7 after a certain buffer time which has been passed since the sixth time point T6, the selected word line starts to discharge.

For the adjacent non-selected word line wl<n+1 or n−1>, the far end wl_far<n+1 or n−1> of the adjacent non-selected word line is still taken as an example for description, at the fourth time point T4 which is before the sixth time point T6 and after the third time point T3, the voltage on Vneg_local<n+1 or n−1> is changed from the second voltage V2 to the third voltage V3, it may be understood that the voltage provided by Vneg_local<n+1 or n−1> on the far end wl_far<n+1 or n−1> of the non-selected word line adjacent to the selected word line is changed from the second voltage V2 to the third voltage V3, and the second voltage V2 is less than the third voltage V3. In this way, before starting to float the selected word line, the voltage provided to the adjacent non-selected word line is increased in advance to increase the initial voltage of the adjacent non-selected word line being pulled up by coupling. In the case that the reducing voltage difference between the adjacent non-selected word lines caused by the coupling effect is essentially unchanged, the absolute voltage of the adjacent non-selected word line which is pulled down by coupling is effectively increased.

As shown in FIG. 6, by reducing the voltage provided to the adjacent non-selected word lines before pre-charge of the selected word line, the final voltage being pulled up by coupling from the voltage on the adjacent non-selected word lines is controlled, i.e., it is the highest voltage in the subsequent voltage change; meantime, by increasing the voltage provided to the adjacent non-selected word line before discharge of the selected word line, the final voltage being pulled down by coupling from the voltage on the adjacent non-selected word line is controlled, i.e., it is the lowest voltage in the subsequent voltage change. Since the highest voltage causing the voltage change becomes smaller and the lowest voltage becomes larger, thus during the charge-discharge process of the selected word line, the voltage change ΔV2 on the adjacent non-selected word line may be effectively reduced, thereby alleviating the row hammer problem and GIDL leakage problem.

In an example of the present disclosure, as shown in FIG. 6, the voltage on the adjacent non-selected word line reaches the second voltage V2 at a second time point T2, and the duration between the first time point T1 and the second time point T2 is a first duration ΔT1; the voltage on the adjacent non-selected word line reaches the third voltage V3 at a fifth time point T5; a duration between the fourth time point T4 and the fifth time point T5 is a second duration ΔT2; a time difference between the third time point T3 and the first time point T1 is greater than or equal to the first duration ΔT1; a time difference between the sixth time point T6 and the fourth time point T4 is greater than or equal to the second duration ΔT2.

It may be understood that since when the voltage is transferred to the adjacent non-selected word line wl<n+1 or n−1> over Vneg_local<n+1 or n−1>, the voltage on Vneg_local<n+1 or n−1> is changed from the first voltage V1 to the second voltage V2 at time T2, the time period for starting to decrease from the first voltage V1 to a stable second voltage V2 required by the adjacent non-selected word line wl_<n+1 or n−1> is the first time period ΔT1. Based on this, here the time difference between the third time point T3 and the first time point T1 is greater than or equal to the first time length ΔT1. It may be understood as the pre-charge operation of the selected word line is started when or after the voltage on the adjacent non-selected word line wl_<n+1 or n−1> drops to the second voltage V2, and when the voltage on the adjacent non-selected word line wl_<n+1 or n−1> has not been dropped to the second voltage V2, but is between the first voltage V1 and the second voltage V2, the initial voltage of the adjacent non-selected word line wl_<n+1 or n−1> being pulled up by coupling is not controlled to the lowest.

Similarly, here the time difference between the sixth time point T6 and the fourth time point T4 is greater than or equal to the second time length ΔT2. It may be understood as the discharge operation of the selected word line is started when or after the voltage on the adjacent non-selected word line wl<n+1 or n−1> rises to the third voltage V3, and when the voltage on the adjacent non-selected word line wl<n+1 or n−1> has not been rised to the third voltage V3, but is between the second voltage V2 and third voltage V3, the initial voltage of the adjacent non-selected word line wl_<n+1 or n−1> being pulled down by coupling is not controlled to the highest. In this way, the control effect on the voltage change amplitude of adjacent non-selected word line during the charge-discharge process of the selected word line is further improved by setting the first time period to ensure that the voltage on the adjacent non-selected word line has reached the second voltage V2 before pre-charge of the selected word line and by setting the second time period to ensure that the voltage on the adjacent non-selected word line has reached the third voltage V3 before discharge of the selected word line.

In other examples, after the first time point T1, the timing to start the pre-charge operation of the selected word line may be selected according to actual needs. For example, the pre-charge operation of the selected word line may be started at any time between the first time point T1 and the second time point T2. It may be understood that the pre-charge operation of the selected word line is started before the voltage on the adjacent non-selected word line wl_<n+1 or n−1> drops to the second voltage V2. In this way, while reducing the initial voltage of the adjacent non-selected word line wl_<n+1 or n−1> being pulled up by coupling, the waiting time of the pre-charge operation may also be controlled.

Similarly, after the fourth time point T4, the timing to start the discharge operation of the selected word line may be selected according to actual needs. For example, the discharging operation of the selected word line may be started at any time between the fourth time point T4 and the fifth time point T5. It may be understood that the discharge operation of the selected word line is started before the voltage on the adjacent non-selected word line wl<n+1 or n−1> rises to the third voltage V3. In this way, while increasing the initial voltage of the adjacent non-selected word line wl_<n+1 or n−1> being pulled down by coupling, the waiting time of the discharge operation may also be controlled. In some examples, the first voltage V1 and the third voltage V3 are the same.

In some examples, a relationship between the second voltage and the first voltage, the pre-charge voltage is as the following equation (1):

$$|V2| = r \ (Vpp - V1) \tag{1}$$

where V1 is the first voltage, V2 is the second voltage, Vpp is the pre-charge voltage, and r is the coupling coefficient.

In one example, the coupling coefficient r=C1/C2, where C1 represents the capacitance between the selected word line and the adjacent non-selected word line, and C2 represents the capacitance of the selected word line.

It should be noted that the word line is connected to the memory cell through the gate of the transistor (refer to FIG. 2), the capacitance of the word line refers to the sum of the write capacitance and the load capacitance. The write capacitance refers to the amount of charge that is to be charged or discharged on the word line when data is being written to the memory cell. When a write operation is being performed, it involves transferring charge between the word line and the memory cell to change the charge state of the memory cell. The size of the write capacitor is related to the required amount of charge, the size of the memory cell, etc. The load capacitance refers to the capacitance caused by other circuit components connected to the word line (e.g., read circuit, decoding circuit buffer, etc.). In some examples, the coupling coefficient r is related to the physical distance between a selected word line and an adjacent non-selected word line. The smaller the physical distance between the selected word line and the adjacent non-selected word line is, the greater the capacitance between the selected word line and the adjacent non-selected word line is, and the greater the coupling coefficient r is.

It may be understood that in the case that the first voltage V1 and the third voltage V3 are different, a relationship between the second voltage and the third voltage, the pre-charge voltage is as the following equation (2):

$$|V2| = r \ (Vpp - V3) \tag{equation (2)}$$

where V3 is the third voltage, V2 is the second voltage, Vpp is the pre-charge voltage, and r is the coupling coefficient.

In an example of the present disclosure, take the first voltage V1 and the third voltage V3 being the same as an example for description. As shown in FIG. 5, the peripheral circuit 210 includes: a first voltage generator 214, a second voltage generator 215, a first voltage transfer circuit 211 and a second voltage transfer circuit 212; the first voltage generator 214 connected to the first voltage transfer circuit 211 is configured to provide the first voltage V1; the second voltage generator 215 connected to the second voltage transfer circuit 212 is configured to provide the second voltage V2; the first voltage transfer circuit 211 is configured to transfer the first voltage V1 to the adjacent non-selected word line in response to a first control signal wlup_enb at the fourth time point T4; the second voltage transfer circuit 212 is configured to transfer the second voltage V2 to the adjacent non-selected word line in response to a second control signal wlup_vneg2 at the first time point T1.

In some examples, the first voltage generator 214 and the second voltage generator 215 may belong to the voltage generator of the peripheral circuit. In some specific examples, both the first voltage generator 214 and the second voltage generator 215 may include a charge pump. The first voltage generator 214 and the second voltage generator 215 may be integrated on one charge pump with multiple outputs, or they may belong to different charge pumps.

In some examples, as shown in FIGS. 5 and 6, the peripheral circuit 210 further includes a control signal generating circuit 216; the control signal generating circuit 216 is configured to receive an enable control signal wlup_en and provide the first control signal wlup_enb to the first voltage transfer circuit 211 and provide the second control signal wlup_vneg2 to the second voltage transfer circuit 212.

In some examples, as shown in FIG. 5, the peripheral circuit further includes a plurality of driving circuits for local word line 213 corresponding one-to-one to the word lines; the driving circuit for local word line 213 is configured to, in response to a main word line selection signal mwl_n<k>, a word line selection signal wld<n> and a pre-charge control signal xpp<n>, cause the adjacent non-selected word line to connect to the first voltage transfer circuit 211 at the third time point T3, and cause the adjacent non-selected word line to connect to the second voltage transfer circuit 212 at the first time point T1; wherein, the main word line selection signal mwl_n<k> is to indicate selecting one main word line from the multiple main word lines in the peripheral circuit, each of the main word lines corresponds to multiple word lines; the word line selection signal wld<n> is to indicate selecting one word line from the multiple word lines corresponding to the main word line; the pre-charge control signal xpp<n> is to indicate providing the pre-charge voltage to the selected word line.

In some examples, as shown in FIG. 5, the control signal generating circuit 216 is connected to the first voltage transfer circuit 211 through a first node N1; and the control signal generating circuit 216 is connected to the second voltage transfer circuit 212 through a second node N2; the first voltage transfer circuit 211 and the second voltage transfer circuit 212 are both connected to the driving circuit for local word line 213 through a third node N3; the first voltage generator 214 and the second voltage generator 215 are both connected to the control signal generating circuit 216.

In some examples, the plurality of driving circuits for local word line are divided into a plurality of groups; each group corresponds to one first voltage generator, one second voltage generator, one first voltage transfer circuit and one second voltage transfer circuit.

It may be understood that a word line may be selected through both of the main word line selection signal mwl_n<k> and the word line selection signal wld<n>, each word line corresponds to a driver circuit for local word line; the plurality of driving circuits for local word line corresponding to plurality of word lines are divided into a plurality of groups according to different word line selection signals wld<n>, the word line selection signals wld<n> corresponding to all word lines in a same group are in a same level state, the main word line selection signals mwl_n<k> corresponding to the selected word lines or the non-selected word lines in a same group are in different level states.

In one example, one block shares a control signal generating circuit, and 16 driving circuits for local word line in one block are divided into 4 groups, and each group shares a same first voltage generator, a same second voltage generator, a same first voltage transfer circuit and a same second voltage transfer circuit. That is, the 16 word lines corresponding to the driving circuits for local word line are divided into 4 groups, which are respectively connected to 4 first voltage transfer circuits and 4 second voltage transfer circuits, and every 4 word lines are connected to a same first voltage transfer circuit and a same second voltage transfer circuit, four word lines connected to a same first voltage transfer circuit and a same second voltage transfer circuit will be selected or not selected at the same time, and the corresponding word line selection signals wld<n> are the same.

In this way, the circuit area can be significantly reduced through a plurality of driving circuits for local word line in each group of the driving circuits for local word line sharing one first voltage generator, one second voltage generator, one first voltage transfer circuit and one second voltage transfer circuit.

Figure 7:
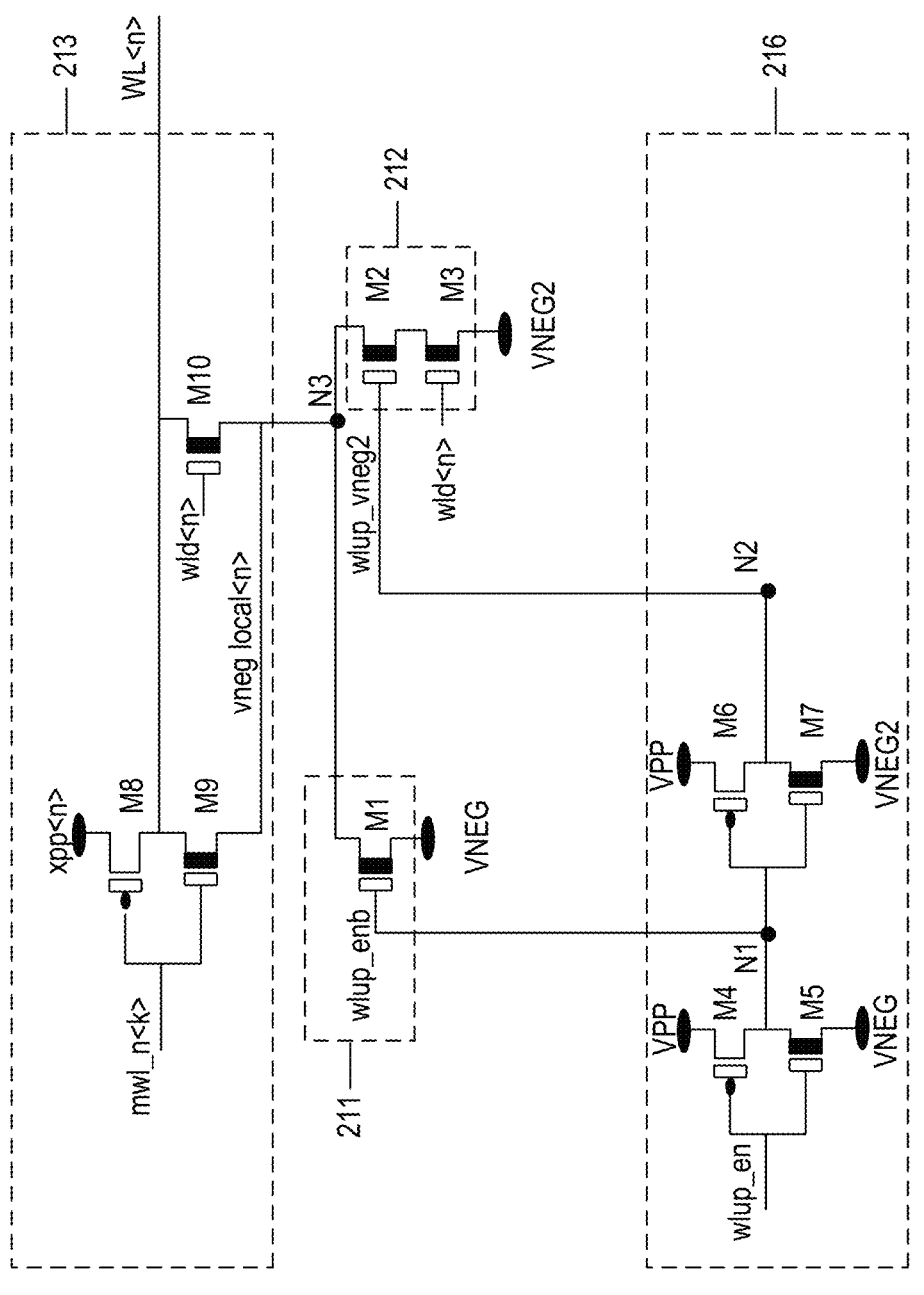
FIG. 7 is a schematic diagram of partial structure of a peripheral circuit provided by an example of the present disclosure.

FIG. 7 is a partial structure schematic diagram of a peripheral circuit provided by an example of the present disclosure. In some examples, as shown in FIG. 7, the first voltage transfer circuit 211 includes a first transistor M1, and the second voltage transfer circuit 212 includes a second transistor M2 and a third transistor M3;

the first terminal of the first transistor is to receive the first control signal wlup_enb, the second terminal is connected to the first voltage generator (not shown in FIG. 7), and the third terminal is connected to the third terminal of the second transistor M2. The output terminal of the first voltage generator outputs the first voltage V1, and the first voltage V1 may be the voltage VNEG.

The first terminal of the second transistor M2 is to receive the second control signal wlup_vneg2, and the second terminal is connected to the third terminal of the third transistor M3.

The first terminal of the third transistor M3 is to receive the word line selection signal wld<n>, and the second terminal is connected to the output terminal of the second voltage generator (not shown in FIG. 7). The output terminal of the second voltage generator outputs a second voltage V2, and the second voltage V2 may be the voltage VNEG2.

It may be understood that the third terminal of the first transistor M1 and the third terminal of the second transistor M2 are connected through the third node N3.

In some examples, as shown in FIG. 7, the control signal generating circuit 216 includes a fourth transistor M4, a fifth transistor M5, a sixth transistor M6, and a seventh transistor M7; wherein: the first terminal of the fourth transistor M4 is to receive the enable control signal wlup_en, the second terminal is to receive a high-level voltage such as Vpp or Vdd, and the third terminal is connected to the third terminal of the fifth transistor M5 for outputting the first control signal wlup_enb. It may be understood that the third terminal of the fourth transistor M4 and the third terminal of the fifth transistor M5 are connected through the first node N1.

The first terminal of the fifth transistor M5 is connected to the first terminal of the fourth transistor M4, and the second terminal is to receive the voltage VNEG.

The first terminal of the sixth transistor M6 is to receive the first control signal wlup_en, the second terminal is to receive a high-level voltage such as Vpp or Vdd, and the third terminal is connected to the third terminal of the seventh transistor M7 for outputting the second control signal wlup_vneg2. It may be understood that the third terminal of the sixth transistor M6 and the third terminal of the seventh transistor M7 are connected through the second node N2.

The first terminal of the seventh transistor M7 is connected to the first terminal of the sixth transistor M6, and the second terminal is to receive the voltage VNEG2.

In some examples, as shown in FIG. 4, the driving circuit for local word line 213 includes an eighth transistor M8, a ninth transistor M9, and a tenth transistor M10; wherein:

The first terminal of the eighth transistor M8 is to receive the main word line selection signal mwl_n<k>, the second terminal is to receive the pre-charge control signal xpp<n>, and the third terminal is coupled to the selected word line Wl<n>.

The first terminal of the ninth transistor M9 is to receive the main word line selection signal mwl_n<k>, the second terminal is connected to the second terminal of the tenth transistor M10, and the third terminal is coupled to the word line Wl<n>.

The first terminal of the tenth transistor M10 is to receive the word line selection signal wld<n>, the second terminal is connected to the N3 node, i.e., the third terminal of the first transistor M1 and the third terminal of the second transistor M2, and the third terminal is coupled to word line WL<n>.

In some examples, the first transistor M1, the second transistor M2, the third transistor M3, the fourth transistor M4, the fifth transistor M5, the sixth transistor M6, the seventh transistor M7, the eighth transistor M8, the ninth transistor M9 and the tenth transistor M10 are field effect MOS transistors; wherein, the first terminal of the field effect MOS transistor is a gate, the second terminal of the field effect MOS transistor is a source, and the third terminal of the field effect MOS transistor is a drain.

In some examples, the first transistor M1, the second transistor M2, the third transistor M3, the fifth transistor M5, the seventh transistor M7, the ninth transistor M9 and the tenth transistor M10 are N-type channel field effect MOS transistors; the fourth transistor M4, the sixth transistor M6 and the eighth transistor M8 are P-type channel field effect MOS transistors.

It should be noted that FIG. 7 only shows the driving circuit for local word line 213 corresponding to one word line, but in reality, each word line is provided with its corresponding driving circuit for local word line 213.

In an example of the present disclosure, the pre-charge voltage is a high-level voltage; the first voltage, the second voltage and the third voltage are all negative voltages. In one example, the pre-charge voltage is Vpp, the voltage range is from 2.2V to 2.8V; the first voltage and the third voltage are VNEG, the voltage range is from −0.2V to −0.1V; the second voltage is VNEG2, and the voltage range is from −0.8V to −0.4V.

The following, combined with FIGS. 6 and 7, will introduce in detail how to implement the voltage supply to the non-selected word line through various specific circuits in the peripheral circuit during the process of the selected word line from the pre-charge operation to the discharge operation, so as to reduce the large pressure difference caused by coupling to adjacent ones.

Referring to FIGS. 6 and 7, before the first time point T1, the enable control signal wlup_en (not shown in FIG. 6) is a low-level voltage, the fourth transistor M4 is turned on, and the fifth transistor M5 is turned off, therefore, the first control signal wlup_enb provided by the control signal generating circuit 216 to the first voltage transfer circuit 211 is the high-level voltage Vpp, and the first transistor M1 is turned on, thus the voltage VNEG is transferred to the driving circuit for local word line 213 corresponding to the word line through the first transistor M1 in the first voltage transfer circuit 211 being turned on. For all word lines, the main word line selection signal mwl_n<k> and the word line selection signal wld<n> are high-level voltage VPP before time T1, the ninth transistor M9 is turned on, and the tenth transistor M10 is turned on, based on this, the voltages provided by the first voltage transfer circuit 211 on all word lines through M9 and M10 are the voltage VNEG. Here, the voltage VNEG is equal to the first voltage V1 shown in FIG. 6.

At the same time, before time T2, the voltage on the first node N1 is high-level voltage Vpp, the sixth transistor M6 is turned off, and the seventh transistor M7 is turned on, thus the second control signal wlup_vneg2 provided by the control signal generating circuit 216 to the second voltage transfer circuit 212 is the voltage VNEG2, and the second transistor M2 is turned off, thus there is no connection between the second voltage transfer circuit 211 and the driving circuit for local word line, i.e., the second voltage transfer circuit 211 does not provide voltage to the driving circuit for local word line.

Next, at the first time point T1, the enable control signal wlup_en is changed from a low-level voltage to a high-level voltage, the fourth transistor M4 is turned off, and the fifth transistor M5 is turned on, thus the first control signal wlup_enb provided by the control signal generating circuit 216 to the first voltage transfer circuit 211 switches from the high-level voltage Vpp to the voltage VNEG.

At time T2, the voltage on the first node N1 also switches from the high-level voltage Vpp to the voltage VNEG, the sixth transistor M6 is turned on, and the seventh transistor M7 is turned off, thus the second control signal wlup_vneg2 provided by the control signal generating circuit 216 to the second voltage transfer circuit 212 switches from the voltage VNEG2 to the high-level voltage Vpp. Here, the voltage VNEG2 is equal to the second voltage V2 shown in FIG. 6.

At the same time, at the first time point T1, for the adjacent non-selected word line, the first control signal wlup_enb is the voltage VNEG, and the first transistor M1 is turned off. The second control signal wlup_vneg2 is high level Vpp, and the second transistor M2 is turned on. For the non-selected word line, the word line selection signal wld<n> is a high-level voltage, and the third transistor M3 is turned on. Therefore, the voltage VNEG2 is transferred to the driving circuit for local word line 213 corresponding to the adjacent non-selected word line via the second transistor M2 and the third transistor M3 in the second voltage transfer circuit 212. For an adjacent non-selected word line, the word line selection signal wld<n> is a high-level voltage, and the tenth transistor M10 is turned on, thus the voltage VNEG2 is transferred to the corresponding adjacent non-selected word line via the driving circuit for local word line 213. Based on this, at the first time point T1, the voltage provided on the adjacent non-selected word line is reduced from the voltage VNEG to the voltage VNEG2.

It should be noted that at the first time point T1, for the selected word line, the word line selection signal wld<n> is a low-level voltage, the third transistor M3 is turned off, and the tenth transistor M10 is turned off, each of the main word line selection signals mwl_n<k> is changed from high level to low level at time T1, and the pre-charge control signal xpp<n> is low level at time T1, at this time, both the eighth transistor M8 and the ninth transistor M9 are turned off, and the selected word line is floated, however, due to the coupling effect with the adjacent non-selected word line, the voltage on the selected word line gradually decreases from the voltage VNEG.

Next, at the third time point T3, for the selected word line, the pre-charge control signal xpp<n> is changed from a low-level voltage to a high-level voltage, the main word line selection signal mwl_n<k> is a low-level voltage, and the word line selection signal wld<n> is a low-level voltage, at this time, the eighth transistor M8 is turned on, the ninth transistor M9 and the tenth transistor M10 are turned off, and the driving circuit for local word line 213 corresponding to the selected word line starts to provide the pre-charge voltage Vpp to the selected word line through the eighth transistor M8.

At the same time, at the third time point T3, the voltage VNEG2 is still transferred to the corresponding adjacent non-selected word line via the driving circuit for local word line 213. However, due to the coupling effect with the selected word line, the voltage on the adjacent non-selected word line starts to gradually increase from the voltage VNEG2.

Next, at the fourth time point T4, the driving circuit for local word line 213 corresponding to the selected word line still provides the pre-charge voltage Vpp to the selected word line via the eighth transistor M8.

At the same time, at the fourth time point T4, for the adjacent non-selected word line, the first control signal wlup_enb switches from the voltage VNEG to the high-level voltage Vpp, and the first transistor M1 is turned on. The second control signal wlup_vneg2 switches from the high-level voltage Vpp to the voltage VNEG2, and the second transistor M2 is turned off. The word line selection signal wld<n> is a high-level voltage, and the third transistor M3 is turned on. At this time, the voltage VNEG is transferred to the driving circuit for local word line 213 corresponding to the adjacent non-selected word line via the first transistor M1 in the first voltage transfer circuit 211. For an adjacent non-selected word line, the word line selection signal wld<n> is a high-level voltage, and the tenth transistor M10 is turned on, thus the voltage VNEG is transferred to the corresponding adjacent non-selected word line via the driving circuit for local word line 213.

It may be understood that at the fourth time point T4, a voltage provided on the adjacent non-selected word line is changed from the voltage VNEG2 to the voltage VNEG. Here, the voltage VNEG is equal to the third voltage V3 shown in FIG. 6.

Next, at the sixth time point T6, for the selected word line, the pre-charge control signal xpp<n> is changed from a high-level voltage to a low-level voltage, the eighth transistor M8 is turned off, and the driving circuit for local word line 213 corresponding to the selected word line stops providing the pre-charge voltage Vpp to the selected word line, and the memory starts to float the selected word line.

Next, at the seventh time point T7 after a certain buffer time which has been passed since the sixth time point T6, the selected word line starts to discharge. Here, the buffer discharge may be achieved through a falling edge delay circuit (not shown in FIG. 7). At this time, the voltage provided by the driving circuit for local word line 213 corresponding to the adjacent non-selected word line to the adjacent non-selected word line is still VNEG, however, due to the coupling effect with the selected word line, the voltage on the adjacent non-selected word line starts to gradually decrease from the voltage VNEG.

As mentioned before, as the memory size shrinks, the physical distance between word lines will further shrink, and row hammer may affect not only the word lines in adjacent lines, even word lines in nearby rows (two or more adjacent lines) may be affected.

Based on this, in some examples, when the selected word line is the N-th word line, the adjacent non-selected word lines include at least an (N−1)-th word line and an (N+1)-th word line.

In some specific examples, the adjacent non-selected word line further includes word lines spaced from the selected word lines by M word lines; wherein M is a natural number, 1≤M≤4.

Here, M may be determined based on the range of surrounding rows affected by the row hammer in actual applications.

In one example, when the selected word line is the sixth word line, the adjacent non-selected word lines include a fifth word line and a seventh word line. The adjacent non-selected word lines may also include a fourth word line and an eighth word line, a third word line and a ninth word line, and a second word line and a tenth word line.

It should be noted that when the adjacent non-selected word lines include plurality of word lines, each word line is to be applied a corresponding voltage according to the timing required by an example of the present disclosure.

In some examples, for each adjacent non-selected word line of the multiple adjacent non-selected word lines, each adjacent non-selected word line may be dropped from the first voltage V1 to the same second voltage V2 in advance when the rising coupling starts, and each adjacent non-selected word line may be raised from the second voltage V2 to the same third voltage V3 in advance when the down coupling starts.

In some other examples, for each adjacent non-selected word line of the multiple adjacent non-selected word lines, each adjacent non-selected word line may be dropped from the first voltage V1 to a different second voltage V2 in advance when the rising coupling starts, and each adjacent non-selected word line may be raised from the second voltage V2 to a different third voltage V3 in advance when the down coupling starts. Here, the adjustment values between different second voltages V2 and the adjustment values between different third voltages V3 may be determined according to the distance between each adjacent non-selected word line and the selected word line. For example, the smaller the distance is, the greater the coupling effect is, the greater the absolute value of the difference between the first voltage V1 and the second voltage V2 is, and the greater the absolute value of the difference between the second voltage V2 and the third voltage V3 is; the larger the distance is, the smaller the coupling effect is, the smaller the absolute value of the difference between the first voltage V1 and the second voltage V2 is, and the smaller the absolute value of the difference between the second voltage V2 and the third voltage V3 is.

It may be understood that the absolute value of the voltage difference between the second voltage and the first voltage decreases as the distance between the adjacent non-selected word line and the selected word line increases. For example, the greater the distance between the selected word line and the adjacent non-selected word line is, the smaller the capacitance between the selected word line and the adjacent non-selected word line is, the smaller the coupling coefficient r is, and the smaller the impact of the selected word line on the adjacent non-selected word line is, therefore, when the absolute value of the voltage difference between the second voltage and the first voltage is small, the interference of the selected word line to the adjacent non-selected word line may be avoided.

Due to the improvement of the row hammer problem, the refresh frequency of the memory caused by the row hammer problem may be reduced to a certain extent, thus the power of the memory may be reduced to a certain extent, and the complexity of the peripheral circuit of the memory may also decrease as power is reduced.

Figure 8A:
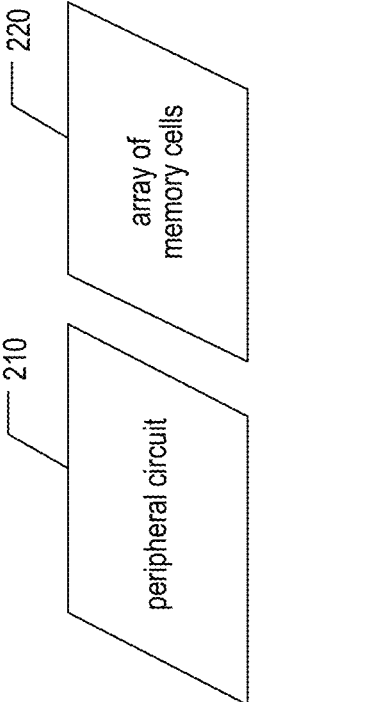
FIG. 8A is a schematic diagram showing the distribution of an array of memory cells and peripheral circuit in an example memory according to an example of the present disclosure.
Figure 8B:
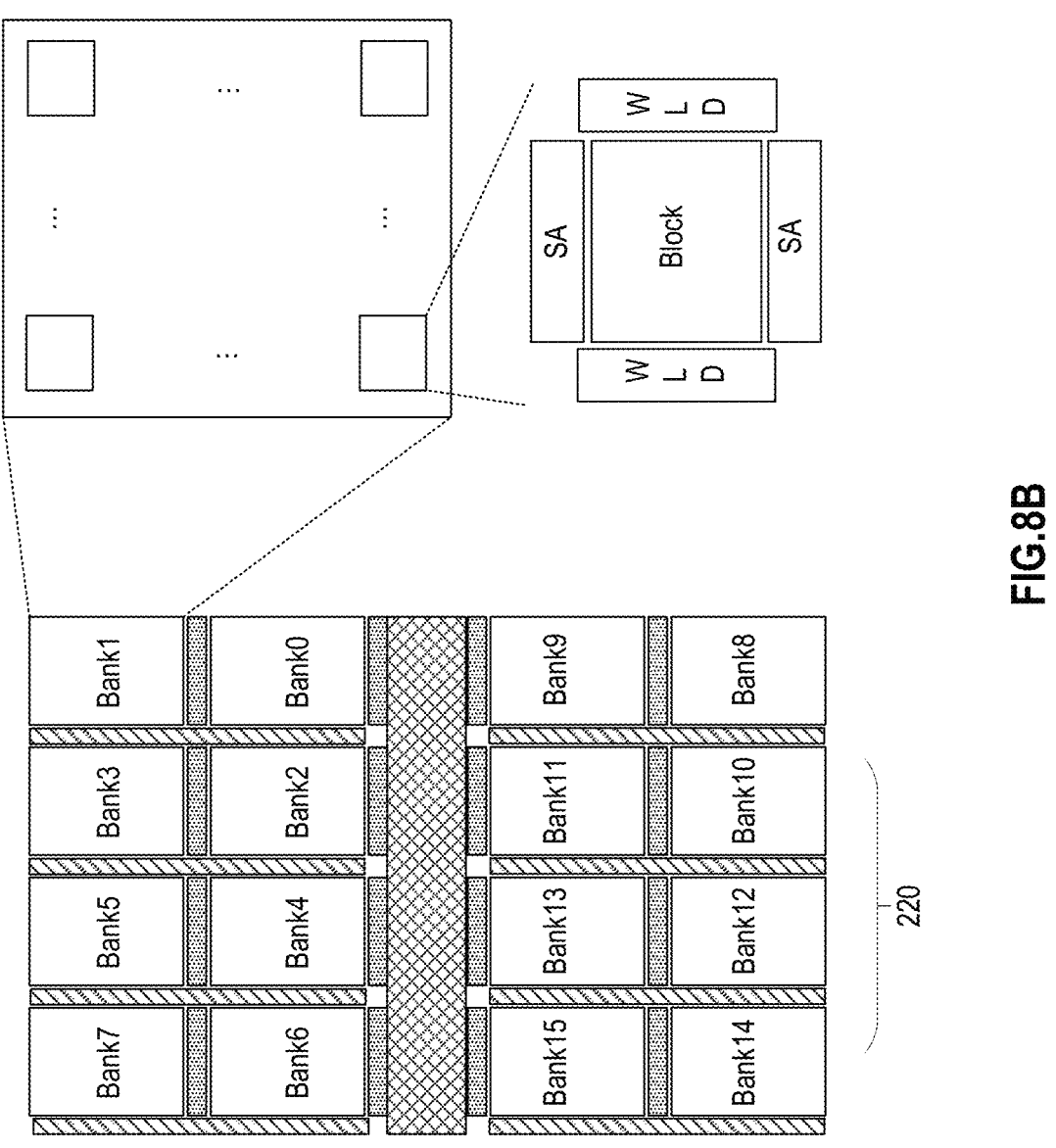
FIG. 8B is a top view schematic diagram showing the distribution of an array of memory cells and peripheral circuit in an example memory according to an example of the present disclosure.

FIG. 8A is a schematic diagram showing the distribution of array of memory cells and peripheral circuit in an example memory according to an example of the present disclosure;

FIG. 8*b* is a top view schematic diagram showing the distribution of array of memory cells and peripheral circuit in an example memory according to an example of the present disclosure.

As shown in FIG. 8A, the array of memory cells 220 and the peripheral circuit 210 are arranged in parallel, more specifically, the array of memory cells includes M banks, and each bank includes N blocks, at least one side of each block is provided with a control circuit corresponding to the block, and at least one side of each bank is provided with a control circuit corresponding to the bank, every K banks of M banks form a bank row, M banks form M/K bank rows, a peripheral circuit corresponding to all banks is provided between the two bank rows in the middle. It should be noted that here M, N, and K are all positive integers, and M is an integer multiple of K.

In one example, as shown in FIG. 8B, the array of memory cells 220 includes 16 banks Bank0-Bank15, and each bank includes multiple blocks, each block is surrounded by corresponding blocks SA and WLD, both sides of each bank are provided with column decoders and row decoders corresponding to the bank, every 4 banks form a bank row, 16 banks form 4 bank rows, a control circuit corresponding to all banks is provided between the two bank rows in the middle. It should be noted that the number of banks in FIG. 8*b* is only used as an example and is not used to limit the number of banks in the memory in the present disclosure.

As mentioned above, in order to suppress the coupling effect in the example of the present disclosure, a first voltage generator 214, a second voltage generator 215, a control signal generating circuit 216, a first voltage transfer circuit 211 and a second voltage transfer circuit 212, etc., are added. However, in the distribution manner of the array of memory cells and peripheral circuit shown in FIGS. 8A and 8B, there may be no free positions to place these newly added circuits. Considering that the array of memory cells in DRAM occupies a larger area than that of the peripheral circuit, in some examples, the array of memory cells in DRAM and the peripheral circuit are stacked and electrically connected through bonding, there will also be some free space in the semiconductor layer at which the peripheral circuit are located, and these free spaces may be used to place the newly added circuits described above.

Figure 9A:
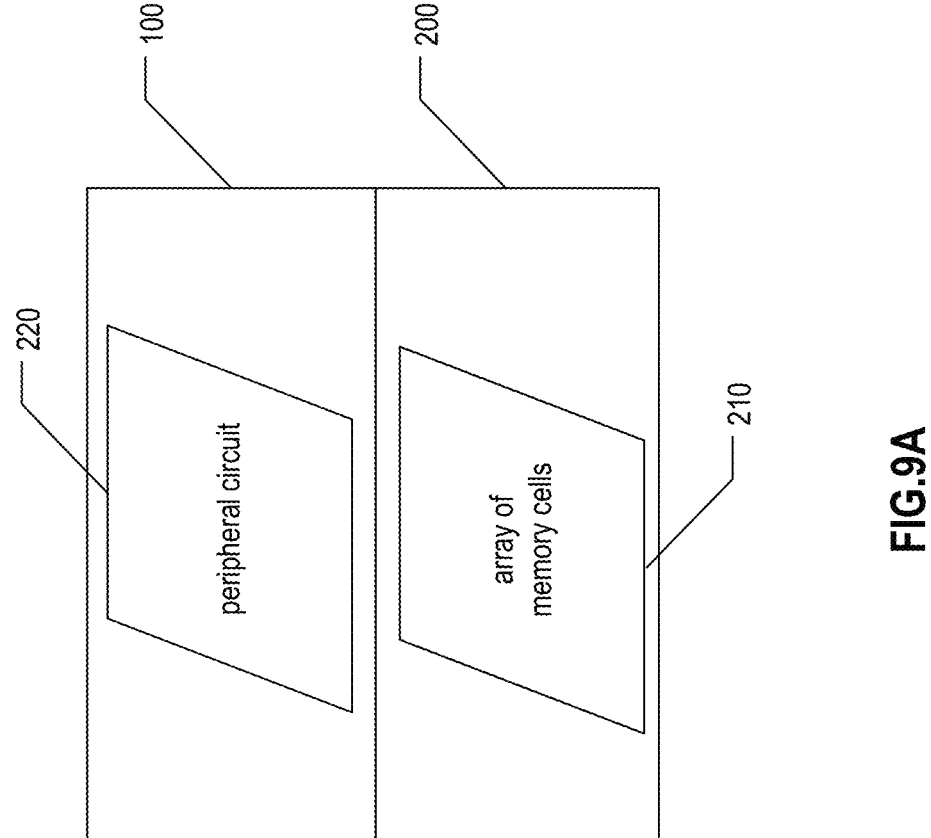
FIG. 9A is a schematic diagram showing the distribution of an array of memory cells and peripheral circuit in an example memory according to another example of the present disclosure.
Figure 9B:
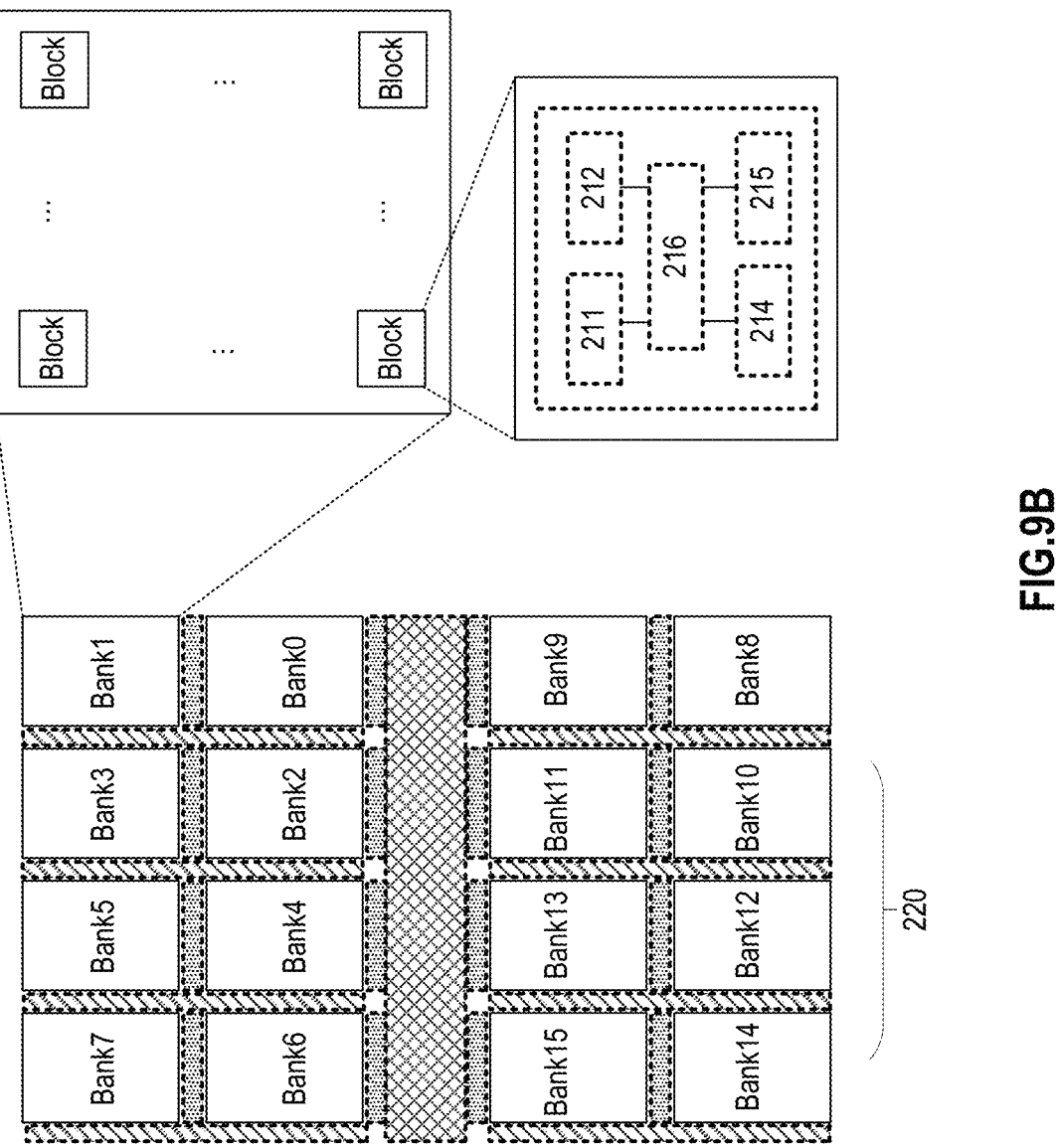
FIG. 9B is a top view schematic diagram showing the distribution of an array of memory cells and peripheral circuit in an example memory according to another example of the present disclosure.

FIG. 9A is a schematic diagram showing the distribution of array of memory cells and peripheral circuit in an example memory according to another example of the present disclosure; FIG. 9B is a top view schematic diagram showing the distribution of array of memory cells and peripheral circuit in an example memory according to another example of the present disclosure.

As shown in FIG. 9A, the first semiconductor structure 100 is located above the second semiconductor structure 200. The first semiconductor structure 100 includes an array of memory cells 220, and the second semiconductor structure 200 includes a peripheral circuit 210.

It should be noted that in FIG. 9B, the first semiconductor structure corresponding to FIG. 9A is located above the second semiconductor structure, and the structure corresponding to the solid line in FIG. 9B is located in the first semiconductor structure, and the structure corresponding to the dotted line is located in the second semiconductor structure, for ease of understanding, the structure in the second semiconductor structure is viewed through perspective. That is, in the enlarged view corresponding to each block in FIG. 9B, the solid line represents the enlarged part of the block, and the dotted line represents the structure in the second semiconductor structure at the position directly below the block.

In one example, as shown in FIG. 9B, the array of memory cells 220 includes 16 banks Bank0-Bank15, and each bank includes multiple blocks Block, a first voltage generator 214, a second voltage generator 215, a control signal generating circuit 216, a first voltage transfer circuit 211 and a second voltage transfer circuit 212 are provided directly below each block, and according to actual needs, a control signal generating circuit 216 shared by the block, and multiple first voltage generators 214, multiple second voltage generators 215, multiple first voltage transfer circuits 211 and multiple second voltage transfer circuits 212 corresponding to the block may be provided directly below the block.

It should be noted that the numbers of the control signal generating circuit 216, the first voltage generator 214, the multiple second voltage generators 215, the first voltage transfer circuit 211 and the second voltage transfer circuit 212 in FIG. 9B are only used as an example and is not used to limit the number and location of the corresponding circuits in the memory in the present disclosure.

It should be noted that in addition to the newly added circuits described above, if space permits, the SA and WLD corresponding to each block may be set directly below the block, i.e., in the dotted box shown in FIG. 9B.

In some specific examples, the array of memory cells 220 and the peripheral circuit 210 are bonded in a manner including but not limited to hybrid bonding, anodic bonding, melt bonding, transfer bonding, adhesive bonding, eutectic bonding, etc.

When the memories are stacked in a bonding manner, the newly added circuits and related circuits such as SA and WLD in an example of the present disclosure may be placed under the array. Because of the manner the stacking is set up, no additional area cost is added.

With the development of memory, such as DRAM, process means are employed to improve or eliminate leakage induced by line hammer, but the scale of the process is getting larger and larger, and the effect is limited. The example of the present disclosure improves the neighborhood wl coupling effect in terms of design control without increasing memory overhead.

FIG. 10 is a schematic flowchart of an implementation of a method for operating a memory provided by an example of the present disclosure. An example of the present disclosure provides a method for operating a memory, the method for operating a memory specifically includes the following steps:

Step S10: start to provide a pre-charge voltage to a selected word line from the plurality of word lines of the memory at a first time; a voltage provided on a non-selected word line adjacent to the selected word line is changed from a first voltage to a second voltage at a second time which is before the first time;

Step S20: start to float the selected word line at a third time which is after the first time; a voltage provided on the adjacent non-selected word line is changed from the second voltage to a third voltage at a fourth time which is before the third time and after the first time; wherein, the second voltage is lower than the first voltage, and the third voltage.

The method will be described below with reference to FIGS. 6 and 10. For the structure of the memory, reference may be made to the relevant descriptions in the example described above and will not be repeated here.

In some examples, start to provide a pre-charge voltage Vpp to a selected word line from the plurality of word lines at a third time point T3; a voltage provided on a non-selected word line adjacent to the selected word line is changed from a first voltage V1 to a second voltage V2 at a first time point T1 which is before the third time point T3; start to float the selected word line at a sixth time point T6 which is after the third time point T3; a voltage provided on the adjacent non-selected word line is changed from the second voltage V2 to a third voltage V3 at a fourth time point T4 which is before the sixth time point T6 and after the third time point T3; wherein, the second voltage V2 is lower than the first voltage V1, and the third voltage V3.

By reducing the voltage provided to the adjacent non-selected word lines before pre-charge of the selected word lines, the final voltage from the voltage on the adjacent non-selected word lines being pulled up by coupling is controlled, i.e., it is the highest voltage in the subsequent voltage change; meantime, by increasing the voltage provided to the adjacent non-selected word line before discharge of the selected word line, the final voltage from the voltage on the adjacent non-selected word line being pulled down by coupling is controlled, i.e., it is the lowest voltage in the subsequent voltage change. In this way, during the charge-discharge process of the selected word line, the voltage change on the adjacent non-selected word line may be effectively reduced, and content change of the adjacent memory cell and bit flipping may be avoided, thereby protecting data security.

In some examples, the voltage on the adjacent non-selected word line reaches the second voltage V2 at a second time point T2, and the duration between the first time point T1 and the second time point T2 is a first duration $\Delta T1$; the voltage on the adjacent non-selected word line reaches the third voltage V3 at a fifth time point T5; a duration between the fourth time point T4 and the fifth time point T5 is a second duration $\Delta T2$; a time difference between the third time point T3 and the first time point T1 is greater than or equal to the first duration $\Delta T1$; a time difference between the sixth time point T6 and the fourth time point T4 is greater than or equal to the second duration $\Delta T2$.

In this way, the control effect on the voltage change amplitude of adjacent non-selected word lines during the charge-discharge process of the selected word line is further improved by setting the first time period to ensure that the voltage on the adjacent non-selected word line has reached the second voltage before pre-charge of the selected word line and by setting the second time period to ensure that the voltage on the adjacent non-selected word line has reached the third voltage before discharge of the selected word line.

In some examples, the first voltage V1 and the third voltage V3 are the same.

An example of the present disclosure further provides a memory system, including at least one memory as disclosed in an example of the present disclosure; and a controller coupled to the memory and configured to control the memory.

Here, the memory may be understood with reference to the memory in the foregoing examples of the present disclosure. The internal composition of the memory system may be understood with reference to the foregoing memory system.

An example of the present disclosure further provides a control circuit for word line voltage, including: a first voltage transfer circuit configured to provide a first transfer voltage in response to a first enable signal before starting to provide a pre-charge voltage to a selected word line; a second voltage transfer circuit configured to provide a second transfer voltage in response to a second enable signal before starting to float the selected word line and after starting to provide a pre-charge voltage to the selected word line; a driving circuit for local word line, connected to both the first voltage transfer circuit and the second voltage transfer circuit, and configured to connect a non-selected word line adjacent to the selected word line to the first voltage transfer circuit before starting to provide a pre-charge voltage to the selected word line, and to connect the adjacent non-selected word line to the second voltage transfer circuit before starting to float the selected word line and after starting to provide a pre-charge voltage to the selected word line.

Here, the structure of the first voltage transfer circuit described above may be understood with reference to the second voltage transfer circuit in FIG. 7, and the second voltage transfer circuit described above may be understood with the first voltage transfer circuit shown in FIG. 7.

The first enable signal described above may be understood with reference to the second control signal wlup_vneg2 shown in FIG. 7, and the first transfer voltage described above may be understood with reference to the second voltage V2 shown in FIG. 6. The second enable signal described above may be understood with reference to the first control signal wlup_enb shown in FIG. 7, and the second transfer voltage described above may be understood with reference to the first voltage V1 shown in FIG. 6.

The methods disclosed in several method examples provided in the present disclosure may be combined arbitrarily without conflicts to obtain new method examples.

The features disclosed in several apparatus examples provided in the present disclosure may be combined arbitrarily without conflicts to obtain new apparatus examples.

The above is only specific implementations of the present disclosure, but the claimed scope of the present disclosure is not limited thereto, and changes or substitutions within the technical scope disclosed in the present disclosure that may be easily conceived by those skilled in the art shall fall within the claimed scope of the present disclosure. Examples of the present disclosure provide memory and operating method thereof, memory system, control circuit for word line voltage. The memory, by reducing the voltage provided to the adjacent non-selected word lines before pre-charge of the selected word lines, controls the final voltage from the voltage on the adjacent non-selected word lines being pulled up by coupling, i.e., it is the highest voltage in the subsequent voltage change; meantime, by increasing the voltage provided to the adjacent non-selected word line before discharge of the selected word line, controls the final voltage from the voltage on the adjacent non-selected word line being pulled down by coupling, i.e., it is the lowest voltage in the subsequent voltage change. Since the highest voltage causing the voltage change becomes smaller and the lowest voltage becomes larger, thus during the charge-discharge process of the selected word line, the voltage change on the adjacent non-selected word line may be effectively reduced, thereby alleviating the row hammer problem and GIDL leakage problem.

What is claimed is:

1. A memory device, comprising:
an array of memory cells;
a plurality of word lines coupled with the memory cells; and
a peripheral circuit coupled to the memory cells through the word lines and configured to:
reduce a first voltage on at least one non-selected word line adjacent to a selected word line to a second voltage;
provide a pre-charge voltage to the selected word line;
increase the second voltage on the non-selected word line to a third voltage; and
float the selected word line;
wherein a magnitude of a voltage difference between the second voltage and the first voltage decreases as a distance between the at least one non-selected word line and the selected word line increases.

2. The memory device of claim 1, wherein:
the pre-charge voltage is provided to the selected word line after the at least one non-selected word line reaching the second voltage; and
the selected word line is floated after the at least one non-selected word line reaching the third voltage.

3. The memory device of claim 1, wherein the first voltage is substantially equal to the third voltage.

4. The memory device of claim 3, wherein a magnitude of the second voltage is a difference between the pre-charge voltage and the first voltage times a coupling coefficient.

5. The memory device of claim 3, wherein the peripheral circuit includes:
a first voltage transfer circuit configured to supply the first voltage to the at least one non-selected word line in response to a first control signal; and
a second voltage transfer circuit configured to supply the second voltage to the at least one non-selected word line in response to a second control signal.

6. The memory device of claim 5, wherein the peripheral circuit further includes a control signal generating circuit configured to:
provide the first control signal to the first voltage transfer circuit and provide the second control signal to the second voltage transfer circuit in response to an enable control signal.

7. The memory device of claim 6, wherein the peripheral circuit further includes a plurality of driving circuits configured to:
in response to a main word line selection signal, a word line selection signal, and pre-charge control signal, cause the at least one non-selected word line adjacent to the selected word line to be connected to the first voltage transfer circuit or the second voltage transfer circuit;
wherein the main word line selection signal indicates a selected main word line from a group of main word lines each corresponding to a subset of the plurality of word lines, the word line selection signal indicating the selected word line in the subset of word lines corresponding to the selected main word line, and the pre-charge control signal indicates providing the pre-charge voltage to the selected word line.

8. The memory device of claim 7, further comprising:

a first voltage generator and a second voltage generator connected to the control signal generating circuit;

wherein the control signal generating circuit is connected to the first voltage transfer circuit at a first node and connected to the second voltage transfer circuit at a second node, the first voltage transfer circuit and the second voltage transfer circuit are connected to the plurality of driving circuits at a third node.

9. The memory device of claim 8, wherein:

the first voltage transfer circuit includes a first transistor, wherein:

a first terminal of the first transistor is to receive the first control signal;

a second terminal of the first transistor is connected to the first voltage generator, and a third terminal of the first transistor is connected to a third terminal of a second transistor; and the second voltage transfer circuit includes:

the second transistor, wherein:

a first terminal of the second transistor is to receive the second control signal, and a second terminal of the second transistor is connected to a third terminal of a third transistor; and the third transistor, wherein:

a first terminal of the third transistor is to receive the word line selection signal, and a second terminal of the third transistor is connected to the second voltage generator.

10. The memory device of claim 9, wherein:

the first transistor, the second transistor and the third transistor include a metal-oxide-semiconductor field-effect transistor (MOSFET); and a first terminal of the MOSFET is a gate, a second terminal of the MOSFET is a source, and a third terminal of the MOSFET is a drain.

11. The memory device of claim 7, wherein the plurality of driving circuits comprise a plurality of groups of local word line driving circuits each corresponding to one first voltage generator, one second voltage generator, one first voltage transfer circuit, and one second voltage transfer circuit.

12. The memory device of claim 1, wherein:

the pre-charge voltage includes a positive voltage; and the first voltage, the second voltage and the third voltage include a negative voltage.

13. The memory device of claim 1, wherein the memory device includes a Dynamic Random Access Memory (DRAM) device.

14. The memory device of claim 13, wherein the array of memory cells and the peripheral circuit are coupled by bonding.

15. The memory device of claim 1, wherein:

the selected word line is an N-th word line, the at least one non-selected word line includes an (N−1)-th word line and an (N+1)-th word line.

16. The memory device of claim 15, wherein the at least one non-selected word line further includes word line spaced from the selected word lines by M word lines, where M is a natural number, $1 \leq M \leq 4$.

17. A memory system, comprising:

at least one memory device comprising:

an array of memory cells;

a plurality of word lines coupled with the memory cells; and a peripheral circuit coupled to the memory cells through the word lines and configured to:

reduce a first voltage on a non-selected word line adjacent to a selected word line to a second voltage, provide a pre-charge voltage to the selected word line, increase the second voltage on the non-selected word line to a third voltage, and float the selected word line; and a memory controller configured to control the at least one memory device through the peripheral circuit;

wherein a magnitude of a voltage difference between the second voltage and the first voltage decreases as a distance between the non-selected word line and the selected word line increases.

18. The memory system of claim 17, wherein a magnitude of the second voltage is a difference between the pre-charge voltage and the first voltage times a coupling coefficient.

19. A method for operating a memory device, comprising:

determining a selected word line from a plurality of word lines coupled with an array of memory cells of the memory device;

reducing a first voltage on at least one non-selected word line adjacent to the selected word line to a second voltage;

providing a pre-charge voltage to the selected word line;

increasing the second voltage on the non-selected word line to a third voltage; and floating the selected word line;

wherein a magnitude of a voltage difference between the second voltage and the first voltage decreases as a distance between the at least one non-selected word line and the selected word line increases.

20. The method of claim 19, wherein:

the pre-charge voltage is provided to the selected word line after the at least one non-selected word line reaching the second voltage; and the selected word line is floated after the at least one non-selected word line reaching the third voltage.

\* \* \* \* \*